United States Patent
Sun

(10) Patent No.: US 9,811,266 B1
(45) Date of Patent: Nov. 7, 2017

(54) DATA BUFFER FOR MULTIPLE DIMM TOPOLOGY

(71) Applicant: CISCO TECHNOLOGY, INC., San Jose, CA (US)

(72) Inventor: Yang Sun, Hangzhou (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/273,274

(22) Filed: Sep. 22, 2016

(51) Int. Cl.
*G11C 16/04* (2006.01)
*G06F 3/06* (2006.01)

(52) U.S. Cl.
CPC ............ *G06F 3/061* (2013.01); *G06F 3/0656* (2013.01); *G06F 3/0683* (2013.01)

(58) Field of Classification Search
CPC ........ G11C 7/1051; G11C 7/10; G11C 7/1006
See application file for complete search history.

(56) References Cited

U.S. PATENT DOCUMENTS

| | | | |
|---|---|---|---|
| 6,697,888 B1 | 2/2004 | Halbert et al. | |
| 7,475,316 B2 * | 1/2009 | Cowell | G11C 5/00 365/201 |
| 9,232,651 B2 | 1/2016 | Ware et al. | |
| 2006/0126408 A1 * | 6/2006 | Bucksch | G11C 7/1078 365/200 |
| 2006/0129712 A1 | 6/2006 | Raghuram | |
| 2007/0280016 A1 * | 12/2007 | Bucksch | G11C 7/1006 365/201 |
| 2009/0248969 A1 * | 10/2009 | Wu | G06F 13/1684 711/105 |
| 2010/0182855 A1 * | 7/2010 | Koshizuka | G11C 7/1051 365/193 |
| 2014/0192583 A1 * | 7/2014 | Rajan | G11C 7/10 365/63 |
| 2015/0255130 A1 | 9/2015 | Lee et al. | |
| 2015/0261446 A1 | 9/2015 | Lee | |
| 2015/0262633 A1 | 9/2015 | Lee | |

\* cited by examiner

*Primary Examiner* — Tuan T Nguyen
(74) *Attorney, Agent, or Firm* — Polsinelli PC

(57) ABSTRACT

Aspects of the embodiments include systems and devices that include a memory controller circuit element, and a printed circuit board (PCB). The PCB can include a memory module element; and a data buffer circuit element, the data buffer circuit element electrically connected to the memory controller circuit element and configured to receive instructions and data from the memory controller circuit element, the data buffer circuit element electrically connected to the memory module circuit element directly or through a socket, the data buffer circuit element configured to transmit instructions and data originated from the memory controller circuit element to the memory module circuit element and transmit data back to the memory controller.

21 Claims, 8 Drawing Sheets

DATA BUFFER FOR MULTIPLE DIMM TOPOLOGY

FIELD

This disclosure pertains to an on-board data buffer for dual in-line memory module (DIMM) input/output speed.

BACKGROUND

Double data rate (DDR) systems have multiple dual in-line memory modules (DIMMs) directly attached to a memory controller. When the DIMM ranks increase, the maximum operating frequency can decrease due to parallel loading. Current load-reduced (LR) DIMM have data buffers on DIMMs, employing a low-capacitance input buffer and output driver to hide and buffer the dynamic random access memory (DRAM) load from the bus. But the branches on the signal transmit path still limit the bandwidth of the channel.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts.

DETAILED DESCRIPTION

Figure 1:
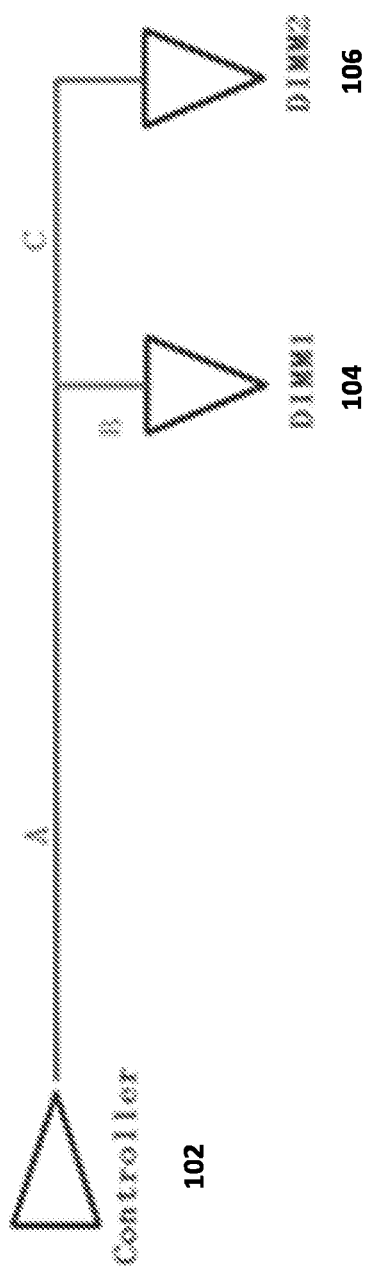
FIG. 1 is a schematic diagram of two DIMM elements connected in parallel to a memory controller.

Aspects of the embodiments are directed to a system that includes a memory controller circuit element, and a printed circuit board (PCB). The PCB can include a memory module element; and a data buffer circuit element, the data buffer circuit element electrically connected to the memory controller circuit element and configured to receive instructions and data from the memory controller circuit element, the data buffer circuit element electrically connected to the memory module circuit element, the data buffer circuit element configured to transmit instructions and data originated from the memory controller circuit element to the memory module circuit element and transmit data back to the memory controller circuit element.

Aspects device that include a printed circuit board (PCB). The PCB can include a memory module circuit element or a memory module socket; and a data buffer circuit element, the data buffer circuit element configured to receive instructions and data from a memory controller circuit element, the data buffer circuit element electrically connected to the memory module circuit element, the data buffer circuit element configured to transmit instructions and data originated from the memory controller circuit element to the memory module circuit element and transmit data back to the memory controller circuit element.

Aspects of the embodiments are directed to a system that includes a memory controller circuit element, and a printed circuit board (PCB). The PCB can include a memory module circuit element; and a multiplexer circuit element, the multiplexer circuit element electrically connected to the memory controller circuit element and configured to receive instructions and data from the memory controller circuit element, the multiplexer circuit element electrically connected to the memory module circuit element, the multiplexer circuit element configured to transmit instructions and data originated from the memory controller circuit element to the memory module circuit element.

Aspects of the embodiments are directed to a method that includes receiving instructions and data from the memory controller circuit element, buffering the data in a data buffer circuit, the data buffer circuit element electrically connected to the memory module circuit element, and transmitting instructions and data originated from the memory controller circuit element to the memory module circuit element.

In some embodiments, the memory module circuit element comprises a dual in-line memory module (DIMM).

In some embodiments, the system comprises a double data rate (DDR) random access memory system.

In some embodiments, the system comprises a plurality of memory modules, and the data buffer circuit element is electrically connected to each of the memory modules, the data buffer circuit element is further configured to transmit instructions and data originating from the memory controller circuit element to one of the plurality of memory module circuit elements and transmit data back to the memory controller circuit element.

In some embodiments, the data buffer circuit element can include a first data buffer sub-element configured to transmit data to the memory module circuit element; and a second data buffer sub-element configured to transmit data from the memory module circuit element.

In some embodiments, the memory controller is configured to control the data buffer circuit element to activate a channel between the memory controller circuit element and memory module.

In some embodiments, the data buffer circuit element is electrically connected to each of a plurality of memory modules, the method can also include transmitting instructions and data originating from the memory controller circuit element to one of the plurality of memory module circuit elements and transmit data back to the memory controller circuit element.

In some embodiments, receiving instructions and data from the memory controller circuit element can include receiving an instruction from a memory controller circuit element to activate a channel between memory controller and memory module; and activating the channel between the memory controller circuit element and the memory module based on the receiving the instruction.

Dual in-line memory module (DIMM) IO speed is limited by the load on the data bus. The data buffers on each load reduced dual in-line memory module (LRDIMM) still may not be enough to sufficiently handle parallel loading and the corresponding limitations associated therewith. FIG. 1 is a schematic diagram 100 of two DIMM elements connected in parallel to a memory controller. FIG. 1 shows a controller 102 connected to DIMM1 104 and DIMM2 106. Branch A extents from the controller 102 and branches to two DIMMS (DIMM1 104 and DIMM2 106). Branch B connects controller 102 for read/write transactions between controller 102 and DIMM1 104, and branch C connects controller 102 for read/write transactions between controller 102 and DIMM2 106. Branch B is normally combined with the DIMM socket pin length and the trace length on the DIMM modules from the golden edge pins to the data buffer/memory chip. And branch C would be longer than the length of branch B plus the trace length on the motherboard PCB (at least the distance between 2 DIMMs, which can be for example 340 mils). Noteworthy is that a 340 mils branch is not negligible for 2000 Mbits or upper data rates.

The eye margin for DIMM1 104 can be reduced due to the B and C branches on the trace topology. Reflections propagated between DIMM1 104, DIMM2 106, and controller 102 can decrease data rates. But as the maximal frequency keeps increasing the impact for the reflection to the channels can aggravate data rate limitations. Therefore, branches connecting DIMMs in parallel can prevent multiple channel DIMMs from achieving higher IO speeds.

This disclosure describes a data buffer on a PCB at a location in the branch topology to remove the trace branches from the memory data channel. The memory controller transacting with each memory would emulate point-to-point communications, facilitating control the reflections between the controller and the DIMMs and also increasing data rates.

Figure 2:
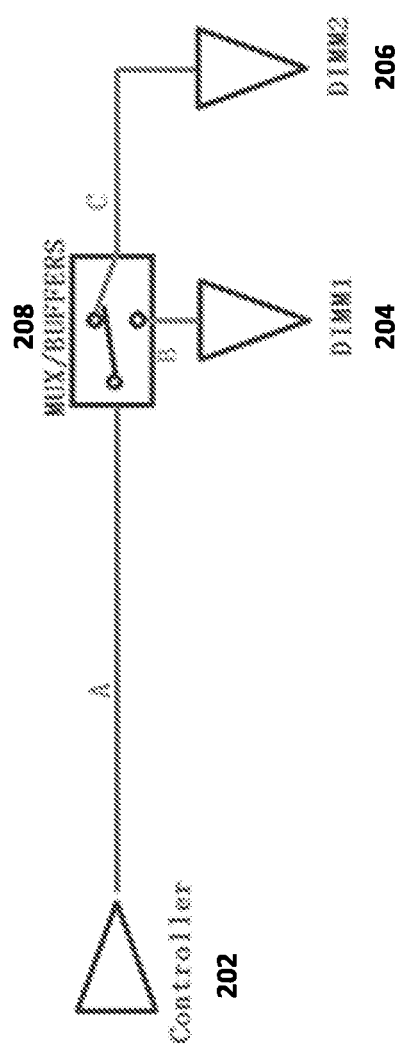
FIG. 2 is a schematic diagram of a memory topology in accordance with embodiments of the present disclosure.

This disclosure describes a data buffer (such as a multiplexer or MUX, a combination of buffers) on PCB boards at the crossing point of the trace A B and C, as shown in FIG. 2. FIG. 2 is a schematic diagram of a memory topology 200 in accordance with embodiments of the present disclosure. Memory topology 200 includes a controller 202, and DIMM1 204 and DIMM2 206. The memory topology 200 includes a buffer element 208 at a location proximate to the branch location point from branch A to branches B and C. This buffer 208 can remove inactivate traces from the channel. The buffer can also completely effectively remove lagging data buses from the channel. Buffer 208 can be a multiplexer or other analogous data buffer structure.

When the controller 202 wants to access DIMM1 204, the buffer/MUX 208 will only switch to trace B. The segment C, essentially, will be logically absent from the data channel. If the controller wants to access DIMM2 206, the buffer/MUX 208 can switch to trace C. Segment B and DIMM1 204 will essentially be absent from the data channel.

The buffer/MUX 208 can make each access, whether a read or write access to DIMM1 or DIMM2, resemble a 1 DIMM per Channel (1DPC) configuration. This topology can increase the data rate in 2DPC, 3DPC or more DPC configurations. The buffer could get some switching control signals directly from the controller 202 or other chips which could decode the address or command bus. The chips could know the bus direction and switching direction and control the buffer/MUX to make the right switching.

The buffer/Mux can receive instructions regarding which branch should be connected to the controller 202 and which should be disconnected during transactions, as well as instructions regarding the directions (i.e., TX vs RX directions). The MUX/buffer can switch quickly to satisfy transaction speed requirements. The buffer/MUX includes one or more input pins to receive information to tell the buffer which branch to select. The controller can provide instructions to the buffer/MUX about when to switch and to which DIMM branch to switch to.

In some embodiments, the controller can transmit sideband signals to control the direction of the buffer and the branch selecting information. In some embodiments, a controller chip can be connected to the memory controller with the address bus and the command bus, such as a registering clock driver (RCD) chip. This controller chip can control the buffer/MUX based on the nature of the DIMM transaction, such as which DIMM to access and/or whether the transaction is a read or a write transaction from decoding command lines and address lines. And the controller chip can output a control signal(s) to the buffer/MUX to selecting the right branch. In some embodiments, the controller chip can be part of the memory controller 202.

Figure 3A:
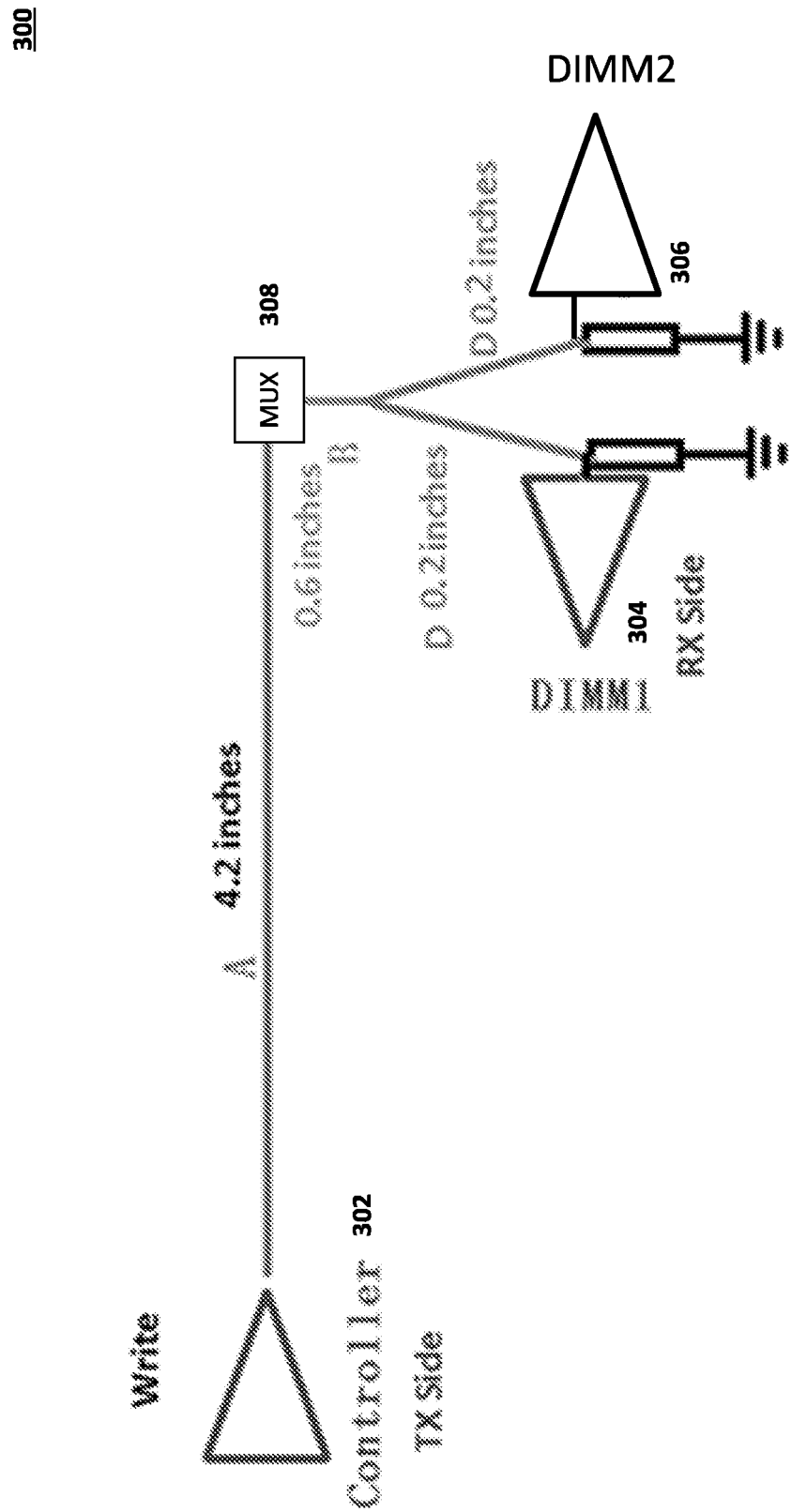
FIG. 3A is a schematic diagram of a DIMM topology using a multiplexer in accordance with embodiments of the present disclosure.
Figure 3B:
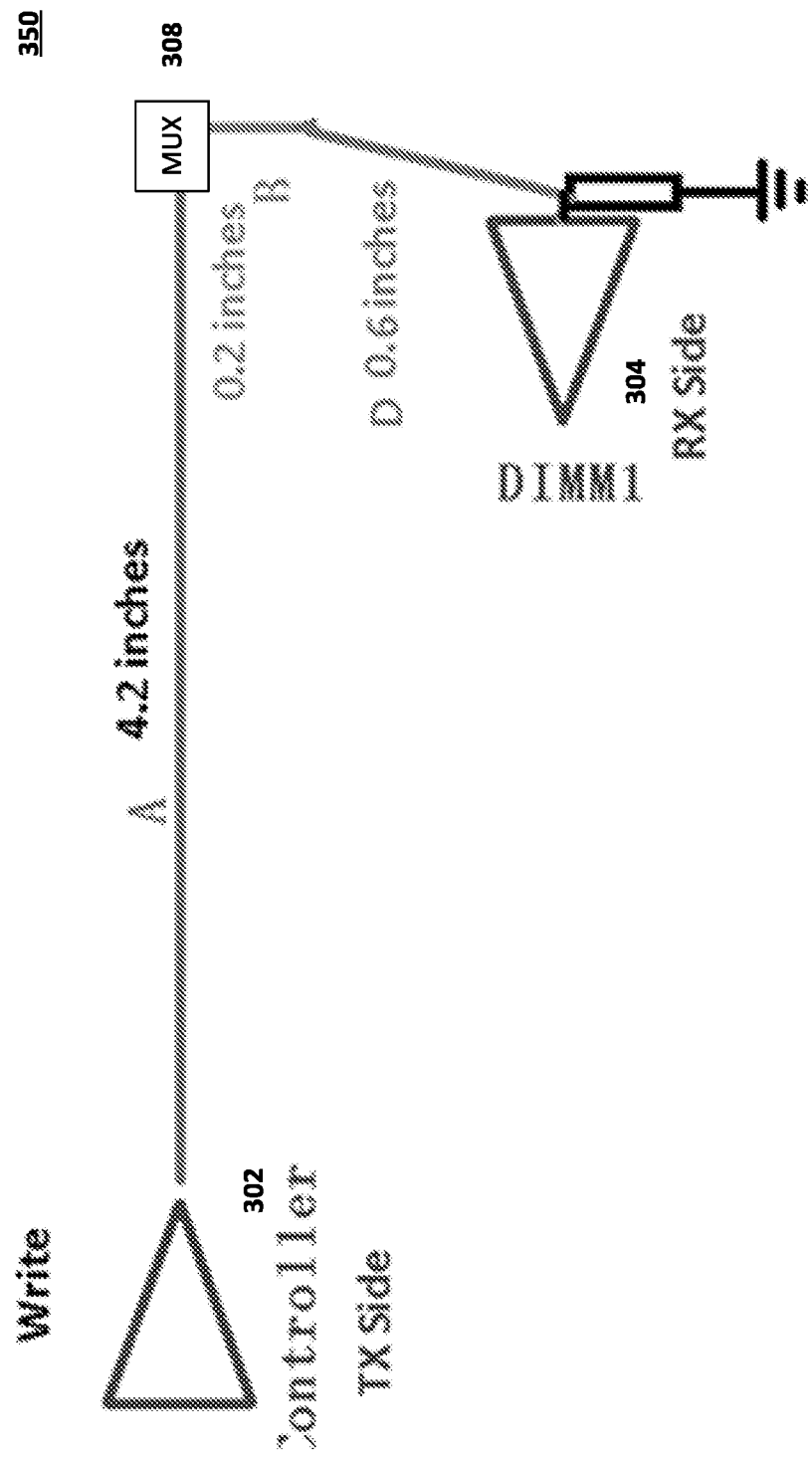
FIG. 3B is a schematic diagram of a logical topology in accordance with embodiments of the present disclosure.

FIG. 3A is a schematic diagram 300 of a DIMM topology using a multiplexer in accordance with embodiments of the present disclosure. A memory controller 302 can control one or more dual in-line memory modules, such as DIMM1 304 and DIMM2 306. A multiplexer 308 can be located at a cross point between connection segment A and segments B & C. The MUX 308 can logically remove the segment after the crossing point of A, B, & C and leave the whole trace like 1DPC configuration. Even with multiple rank DIMMs would like a T topology. As the branches are symmetric and can have small dimensions, by e.g., using double side chip placement for the DIMMs, the signal integrity would be much better than a corresponding LRDIMM topology that does not incorporate the MUX 308, as shown in the topology 300 of FIG. 3A. Additionally, the topology 300 can achieve similar performance as the 1DPC configuration, since the data trace topology in 1DPC would be logically similar to that shown in FIG. 3B. FIG. 3B is a schematic diagram of a logical topology 350 using single rank DIMM in accordance with embodiments of the present disclosure, however, multiple DIMM topologies are contemplated, such as Rank 2 and/or Rank 4 DIMM architectures. In FIG. 3B, the trace topology 350 is logically connecting controller 302 to DIMM1 304 through a MUX 308. Topology 350 mimics the 1DPC or pure point-to-point topology.

MUX 308 could be an active element or a passive element. A MUX can be bidirectional and act as a switch, as shown in FIG. 3A. Normally, the MUX 308 would not isolate the load and it is transparent to the bus. Buffer elements can be used to construct a MUX by enabling different single buffers at different times.

Figure 4A:
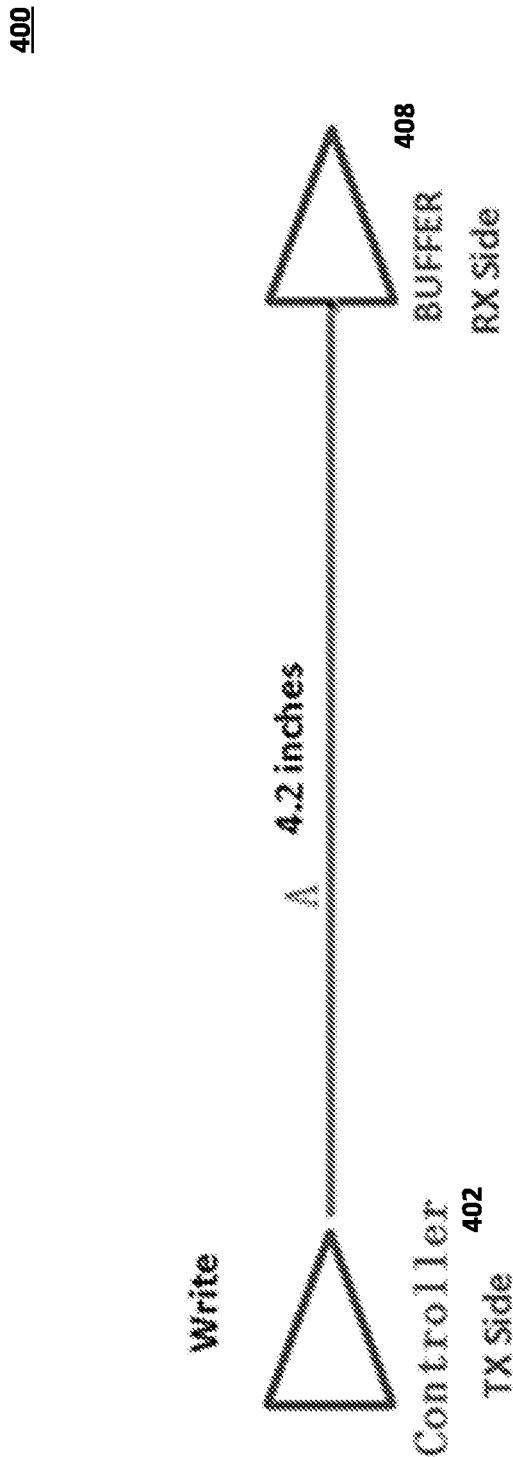
FIG. 4A is a schematic diagram of a partial topology that includes a memory controller in connection with a buffer in accordance with embodiments of the present disclosure.
Figure 4B:
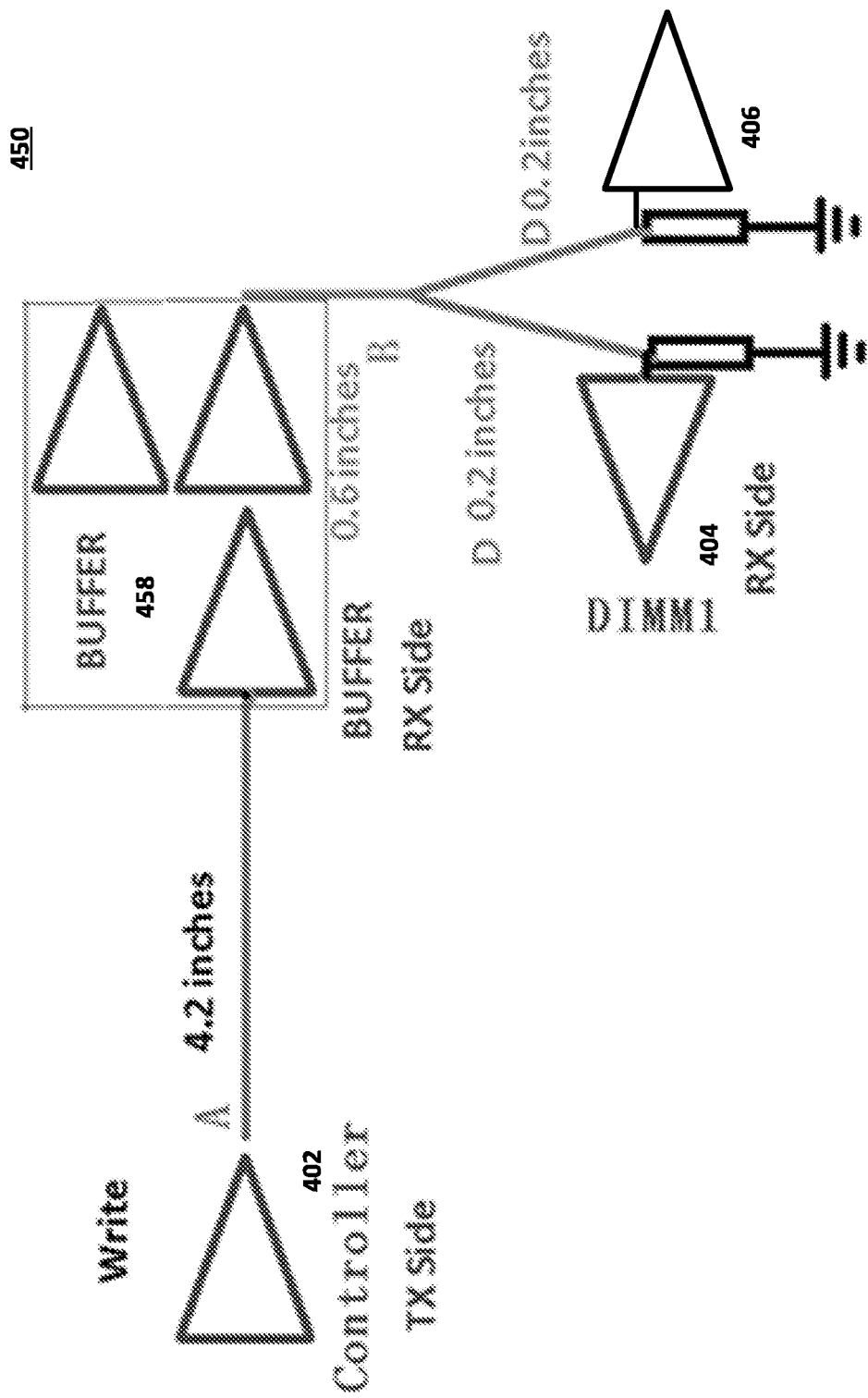
FIG. 4B is a schematic diagram of an example topology that includes a buffer in accordance with embodiments of the present disclosure.

FIG. 4A is a schematic diagram of a partial topology 400 that includes a memory controller 402 in connection with a buffer 408 in accordance with embodiments of the present disclosure. In embodiments that use a data buffer 408, then the controller transmission line ends at the buffer side. The buffer 408 can re-drive the signal to communicate with the DIMMs (shown in FIG. 4B). FIG. 4B is a schematic diagram of an example topology 450 that includes a buffer 408 in accordance with embodiments of the present disclosure. Between the controller 402 and the buffer element 408, this topology 450 acts as a point-to-point topology, and can demonstrate high signal integrity. After the buffer 408, as the signal is re-driven to the one or more DIMMs (DIMM1 404 or DIMM2 406) and the distance from the buffer 408 to each DIMM is shorter, this topology 450 still has high signal integrity. Additionally, with shorter traces, cross-talk can be reduced.

So it is a pure ideal point to point connection topology before the buffer with long trace and still manageable after the buffer with short trace even with multiple rank DIMMs. It would greatly help to improve the signal integrity. There will be no reflection ideally and easy to control from the design. Comparing the 1DPC configuration, before buffer the signal is better as it is a single point to point connection with shorter trace; after the buffer it is still better as the total channel length is much shorter. So the 2DIMM per channel (2DPC) could reach same data rate as 1DPC configuration.

A buffer is an active component that it receives data and re-drives the data and outputs the data. The buffer would isolate the load from the input bus as it receives the data and terminates the bus. Then the buffer will re-drive the signal to the next bus, as shown by branch B in FIG. 4B.

A buffer described here could have two input/output buffer groups "BUFFER1" 414 and "BUFFER 2" 416. There are control/enable signals to separate activate or deactivate either groups to select the appropriate DIMM branch. A single buffer chip is single direction. So, as shown in FIG. 4B, each buffer chip would have two paths: the receive path and the transmit path. The buffer 408 can receive direction control signals to control the directions by the active buffer elements.

Figure 5:
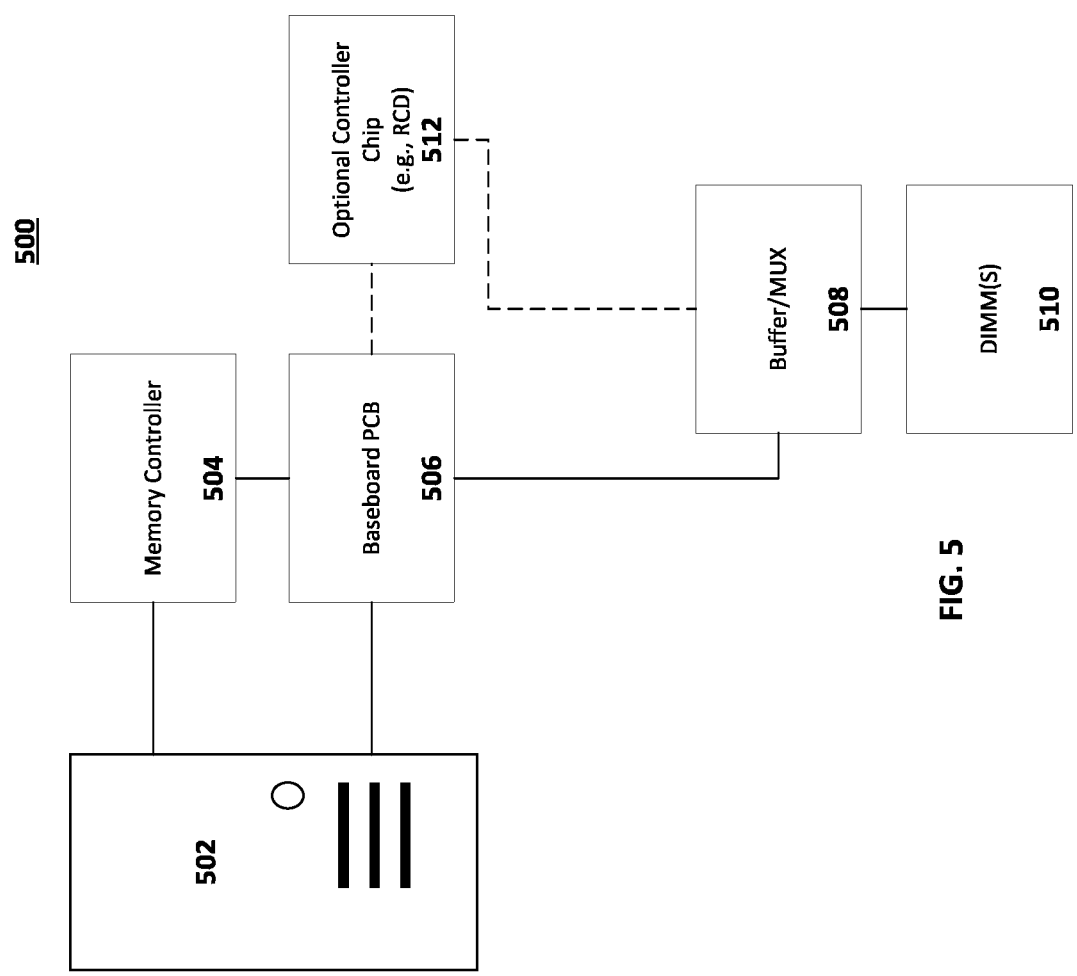
FIG. 5 is a schematic diagram of a computing system in accordance with embodiments of the present disclosure.

FIG. 5 is a schematic diagram of an example computing system 500 in accordance with embodiments of the present disclosure. Computing system 500 can be a personal computer, workstation, embedded system, or can be a server that is part of a network of computing systems, such as that in a data center, enterprise network, local area network, server room, etc. The computing system 500 can include a central processing unit 502. Central processing unit 502 can include a memory controller 504, as described above. The memory controller 504 can control one or more memory units, such as dual in-line memory module(s) 510. The memory controller 504 can be connected to a buffer/MUX 508 that resides on a baseboard printed circuit board (PCB) 506 that also holds the memory units 510.

An optional controller chip 512, such as an RCD, can be used as a memory controller to send data and instructions to the buffer/MUX 508 for controlling the active channel for executing memory transactions.

Figure 6:
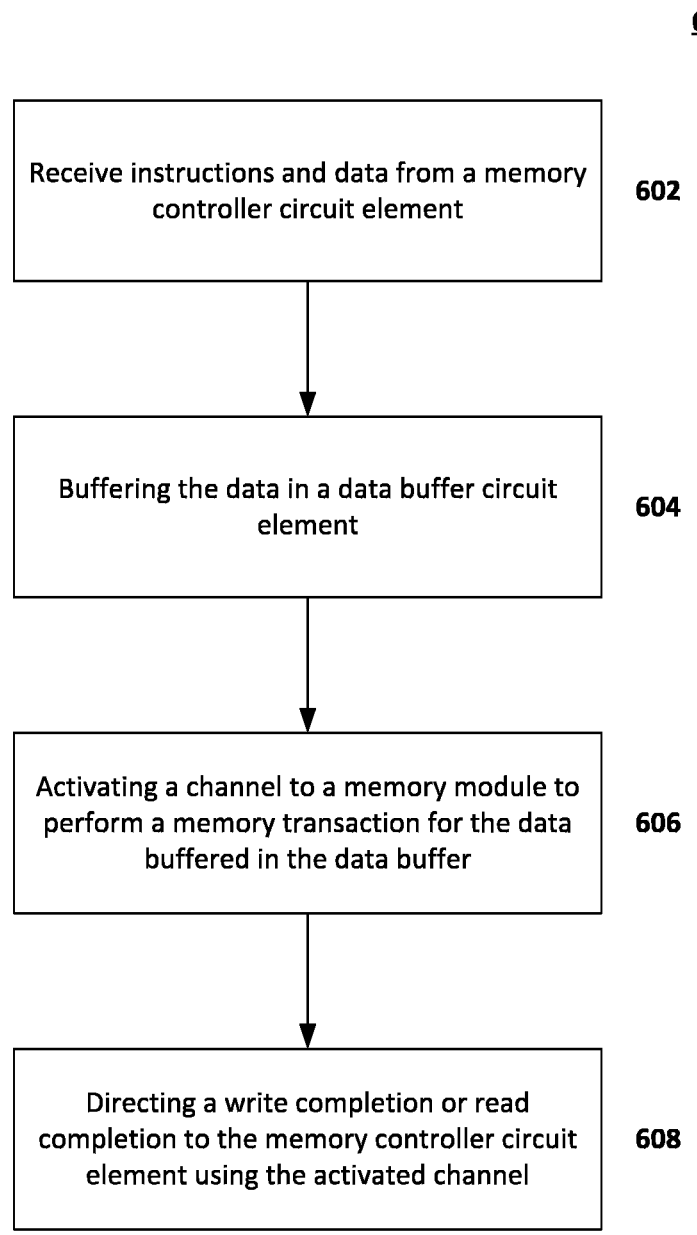

FIG. 6 is a process flow diagram for buffering data and routing data to a memory module in accordance with embodiments of the present disclosure. A data buffer circuit element can receive instructions and data from the memory controller circuit element, the data buffer circuit element electrically connected to the memory module circuit element (602). The data can be buffered in the data buffer circuit (604). The data buffer can activate or open a channel between the memory controller circuit element and a memory module (606). The buffered data can be written to the memory module. In some embodiments, the instructions can cause the buffer to open a channel to a memory module to execute a read transaction. The data buffer can also activate the channel for read and write completions to be transmitted between the memory module and the memory controller circuit element (608).

Variations and Implementations

Within the context of the disclosure, a network used herein represents a series of points, nodes, or network elements of interconnected communication paths for receiving and transmitting packets of information that propagate through a communication system. A network offers communicative interface between sources and/or hosts, and may be any local area network (LAN), wireless local area network (WLAN), metropolitan area network (MAN), Intranet, Extranet, Internet, WAN, virtual private network (VPN), or any other appropriate architecture or system that facilitates communications in a network environment depending on the network topology. A network can comprise any number of hardware or software elements coupled to (and in communication with) each other through a communications medium.

In one particular instance, the architecture of the present disclosure can be associated with a service provider deployment. In other examples, the architecture of the present disclosure would be equally applicable to other communication environments, such as an enterprise wide area network (WAN) deployment, The architecture of the present disclosure may include a configuration capable of transmission control protocol/internet protocol (TCP/IP) communications for the transmission and/or reception of packets in a network.

As used herein in this Specification, the term 'network element' is meant to encompass any of the aforementioned elements, as well as servers (physical or virtually implemented on physical hardware), machines (physical or virtually implemented on physical hardware), end user devices, routers, switches, cable boxes, gateways, bridges, loadbalancers, firewalls, inline service nodes, proxies, processors, modules, or any other suitable device, component, element, proprietary appliance, or object operable to exchange, receive, and transmit information in a network environment. These network elements may include any suitable hardware, software, components, modules, interfaces, or objects that facilitate the network service header features/operations thereof. This may be inclusive of appropriate algorithms and communication protocols that allow for the effective exchange of data or information.

In one implementation, nodes with NSH capabilities may include software to achieve (or to foster) the functions discussed herein for providing the NSH-related features/functions where the software is executed on one or more processors to carry out the functions. This could include the implementation of instances of service functions, service header processors, metadata augmentation modules and/or any other suitable element that would foster the activities discussed herein. Additionally, each of these elements can have an internal structure (e.g., a processor, a memory element, etc.) to facilitate some of the operations described herein. In other embodiments, these functions may be executed externally to these elements, or included in some other network element to achieve the intended functionality. Alternatively, these nodes may include software (or reciprocating software) that can coordinate with other network elements in order to achieve the functions described herein. In still other embodiments, one or several devices may include any suitable algorithms, hardware, software, components, modules, interfaces, or objects that facilitate the operations thereof.

In certain example implementations, the NSH-related functions outlined herein may be implemented by logic encoded in one or more non-transitory, tangible media (e.g., embedded logic provided in an application specific integrated circuit [ASIC], digital signal processor [DSP] instructions, software [potentially inclusive of object code and source code] to be executed by one or more processors, or other similar machine, etc.). In some of these instances, one or more memory elements can store data used for the operations described herein. This includes the memory element being able to store instructions (e.g., software, code, etc.) that are executed to carry out the activities described in this Specification. The memory element is further configured to store databases or metadata disclosed herein. The processor can execute any type of instructions associated with the data to achieve the operations detailed herein in this Specification. In one example, the processor could transform an element or an article (e.g., data) from one state or thing to another state or thing. In another example, the activities outlined herein may be implemented with fixed logic or programmable logic (e.g., software/computer instructions executed by the processor) and the elements identified herein could be some type of a programmable processor, programmable digital logic (e.g., a field programmable gate array [FPGA], an erasable programmable read only memory (EPROM), an electrically erasable programmable ROM (EEPROM)) or an ASIC that includes digital logic, software, code, electronic instructions, or any suitable combination thereof.

Any of these elements (e.g., the network elements, service nodes, etc.) can include memory elements for storing information to be used in achieving the NSH-related features, as outlined herein. Additionally, each of these devices may include a processor that can execute software or an algorithm to perform the NSH-related features as discussed in this Specification. These devices may further keep information in any suitable memory element [random access memory (RAM), ROM, EPROM, EEPROM, ASIC, etc.], software, hardware, or in any other suitable component, device, element, or object where appropriate and based on particular needs. Any of the memory items discussed herein should be construed as being encompassed within the broad term 'memory element.' Similarly, any of the potential processing elements, modules, and machines described in this Specification should be construed as being encompassed within the broad term 'processor.' Each of the network elements can also include suitable interfaces for receiving, transmitting, and/or otherwise communicating data or information in a network environment.

Additionally, it should be noted that with the examples provided above, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that the systems described herein are readily scalable and, further, can accommodate a large number of components, as well as more complicated/sophisticated arrangements and configurations. Accordingly, the examples provided should not limit the scope or inhibit the broad techniques of using and augmenting NSH metadata, as potentially applied to a myriad of other architectures.

It is also important to note that the various steps described herein illustrate only some of the possible scenarios that may be executed by, or within, the nodes with NSH capabilities described herein. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by nodes with NSH capabilities in that any suitable arrangements, chronologies, configurations, and timing mechanisms may be provided without departing from the teachings of the present disclosure.

It should also be noted that many of the previous discussions may imply a single client-server relationship. In reality, there is a multitude of servers in the delivery tier in certain implementations of the present disclosure. Moreover, the present disclosure can readily be extended to apply to intervening servers further upstream in the architecture, though this is not necessarily correlated to the 'm' clients that are passing through the 'n' servers. Any such permutations, scaling, and configurations are clearly within the broad scope of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A system comprising:
    a memory controller circuit element, and
    a printed circuit board (PCB), the PCB comprising:
        a memory module circuit element; and
        a data buffer circuit element, the data buffer circuit element electrically connected to the memory controller circuit element and configured to receive instructions and data from the memory controller circuit element, the data buffer circuit element electrically connected to the memory module circuit element, the data buffer circuit element configured to transmit instructions and data originated from the memory controller circuit element to the memory module circuit element and transmit data back to the memory controller circuit element.

2. The system of claim 1, wherein the memory module circuit element comprises a dual in-line memory module (DIMM).

3. The system of claim 1, wherein the system comprises a double data rate (DDR) random access memory system.

4. The system of claim 1, wherein the system comprises a plurality of memory modules, and the data buffer circuit element is electrically connected to each of the memory modules, the data buffer circuit element is further configured to transmit instructions and data originating from the memory controller circuit element to one of the plurality of memory module circuit elements and transmit data back to the memory controller circuit element.

5. The system of claim 1, wherein the data buffer circuit element comprises:
    a first data buffer sub-element configured to transmit data to the memory module circuit element; and
    a second data buffer sub-element configured to transmit data from the memory module circuit element.

6. The system of claim 1, wherein the memory controller is configured to control the data buffer circuit element to activate a channel between the memory controller circuit element and memory module.

7. A device comprising:
    a printed circuit board (PCB), the PCB comprising:
        a memory module circuit element or a memory module socket; and
        a data buffer circuit element, the data buffer circuit element configured to receive instructions and data from a memory controller circuit element, the data buffer circuit element electrically connected to the memory module circuit element, the data buffer circuit element configured to transmit instructions and data originated from the memory controller circuit element to the memory module circuit element and transmit data back to the memory controller circuit element.

8. The device of claim 7, wherein the memory module circuit element comprises a dual in-line memory module (DIMM).

9. The device of claim 7, wherein the system comprises a double data rate (DDR) random access memory system.

10. The device of claim 7, wherein the system comprises a plurality of memory modules, and the data buffer circuit element is electrically connected to each of the memory modules, the data buffer circuit element is further configured to transmit instructions and data originating from the memory controller circuit element to one of the plurality of memory module circuit elements and transmit data back to the memory controller circuit element.

11. The device of claim 7, wherein the data buffer circuit element comprises:
a first data buffer sub-element configured to transmit data to the memory module circuit element; and
a second data buffer sub-element configured to transmit data from the memory module circuit element.

12. The device of claim 7, wherein the data buffer circuit element is configured to receive control instructions from the memory controller circuit element to activate a channel between memory controller circuit element and memory module.

13. A system comprising:
a memory controller circuit element, and
a printed circuit board (PCB), the PCB comprising:
a memory module circuit element; and
a multiplexer circuit element, the multiplexer circuit element electrically connected to the memory controller circuit element and configured to receive instructions and data from the memory controller circuit element, the multiplexer circuit element electrically connected to the memory module circuit element, the multiplexer circuit element configured to transmit instructions and data originated from the memory controller circuit element to the memory module circuit element.

14. The system of claim 13, wherein the memory module circuit element comprises a dual in-line memory module (DIMM).

15. The system of claim 13, wherein the system comprises a double data rate (DDR) random access memory system.

16. The system of claim 13, wherein the system comprises a plurality of memory modules, and the multiplexer circuit element is electrically connected to each of the memory modules, the multiplexer circuit element is further configured to route instructions and data originating from the memory controller circuit element to one of the plurality of memory module circuit elements and transmit data back to the memory controller circuit element.

17. The system of claim 13, wherein the multiplexer circuit element is configured to:
receive control instructions from a memory controller circuit element to activate a channel to execute a memory transaction with the memory module circuit element.

18. The system of claim 13, wherein the memory controller circuit element is configured to control the multiplexer circuit element to activate a channel between memory controller circuit element and memory module circuit element.

19. A method comprising
receiving instructions and data from the memory controller circuit element,
buffering the data in a data buffer circuit, the data buffer circuit element electrically connected to the memory module circuit element, and
transmitting instructions and data originated from the memory controller circuit element to the memory module circuit element.

20. The method of claim 19, wherein the data buffer circuit element is electrically connected to each of a plurality of memory modules, the method further comprising:
transmitting instructions and data originating from the memory controller circuit element to one of the plurality of memory module circuit elements and transmit data back to the memory controller circuit element.

21. The method of claim 19, wherein receiving instructions and data from the memory controller circuit element comprises:
receiving an instruction from a memory controller circuit element to activate a channel between memory controller and memory module; and
activating the channel between the memory controller circuit element and the memory module based on the receiving the instruction.

* * * * *